United States Patent [19]

Okita

[11] 4,288,766

[45] Sep. 8, 1981

[54] MICROWAVE CIRCUIT

[75] Inventor: Toshimichi Okita, Hatano, Japan

[73] Assignee: Sony Corporation, Tokyo, Japan

[21] Appl. No.: 92,639

[22] Filed: Nov. 8, 1979

[30] Foreign Application Priority Data

Nov. 13, 1979 [JP] Japan ................................ 53-139713

[51] Int. Cl.[3] ........................ H03H 1/203; H03H 3/08

[52] U.S. Cl. .................................... 333/204; 333/202; 333/246

[58] Field of Search ................................ 333/202-205, 333/246

[56] References Cited

U.S. PATENT DOCUMENTS 3,345,589 10/1967 Di Piazza ............................ 333/204

3,875,538 4/1975 Minet et al. ......................... 333/204

4,074,214 2/1978 Aichholzer ........................ 333/204

*Primary Examiner*—Marvin L. Nussbaum

*Attorney, Agent, or Firm*—Hill, Van Santen, Steadman, Chiara & Simpson

[57] ABSTRACT

A microwave circuit having a transmission line, a conductor and a dielectric gripped therebetween is disclosed. In this case, stubs are provided on the transmission line in at least two positions, at least one of the stubs extends across the transmission line to the both sides thereof with different lengths, and the distance between adjacent stubs and the lengths thereof are so selected that the transmission line has a predetermined frequency band and attenuation characteristics.

1 Claim, 8 Drawing Figures

MICROWAVE CIRCUIT

BACKGROUND OF THE INVENTION

1. Field of the Invention

The present invention relates generally to a microwave circuit and is directed more particularly to a microwave circuit in which a stop line or micro-strip is used.

2. Description of the Prior Art

In a prior art microwave circuit generally used, as shown in FIG. 1, on an dielectric such as ceramic dielectric substrate 1 made of, for example, alumina or the like, there is formed a microwave conductor i.e. transmission line 2, while on the back surface of the substrate 1 there is formed a conductor 3 to be grounded therethrough. Thus, this prior art microwave circuit is a micro strip line. Further, though not shown, a so-called strip line is used in which the structure of a conductor-dielectric-transmission line is arranged symmetrical with respect to the transmission line.

In a band pass filter of the prior art microwave circuit, for example, micro strip line band pass filter 5 in which at two positions of the main transmission line 2 there are provided stubs 4 of $\lambda/2$ length ($\lambda$ is the wave length) in parallel with each other with the distance of $\lambda/4$ as shown in FIG. 2 (where only the pattern of the transission line is shown), the frequency characteristic of insertion loss becomes as shown by a curve I in the graph of FIG. 3 and the attenuation characteristic thereof is very gentle.

Further, in a band pass filter 6 with the pattern shown in FIG. 4, if the number of elements, which form the band pass filter 6, is increased somewhat, its attenuation characteristic can be made sharp by some extent. In this case, however, there is newly caused such a defect that the insertion loss of the pass band increases.

OBJECTS AND SUMMARY OF THE INVENTION

Accordingly, an object of the invention is to provide a novel microwave circuit free from the defect encountered in the prior art.

Another object of the invention is to provide a microwave circuit which is simple in construction but free of the above defects.

A further object of the invention is to provide a band pass filter for use in a microwave circuit which has sharp rising-up and falling-down characteristics.

A still further object of the invention is to provide a band pass filter for use in a microwave circuit which has sharp attenuation characteristics.

According to an aspect of the present invention, a microwave circuit is provided which comprises a dielectric; a transmission line mounted on one surface of said dielectric; a conductor mounted on the other surface of said dielectric; and at least two stubs provided on said transmission line at different positions thereof, at least one of said stubs being extending across said transmission line on both sides of said transmission line with different lengths, the lengths of said stubs and distance between adjacent stubs being so selected that said transmission line has predetermined frequency band and attenuation characteristics.

The other objects, features and advantages of the present invention will become clear from the following description taken in conjunction with the accompanying drawings through which the like reference numerals designate the same elements.

DESCRIPTION OF THE PREFERRED EMBODIMENTS

The present invention will be hereinafter described with reference to the attached drawings.

Figure 1:
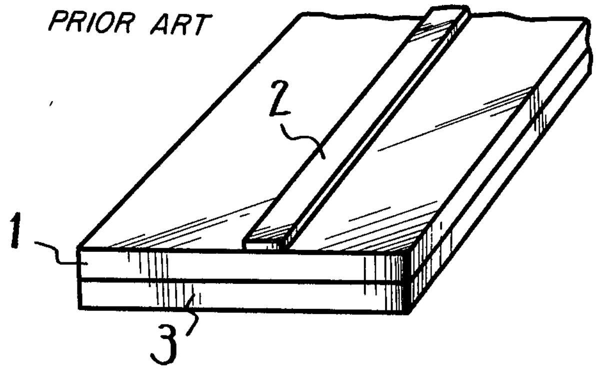
FIG. 1 PRIOR ART
FIG. 1 is a perspective view showing a microstrip line to which the present invention is applied.
Figure 2:
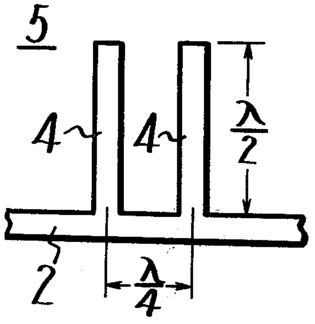
FIG. 2 PRIOR ART
FIG. 2 is a diagram showing a line pattern of a prior art band pass filter.
Figure 3:
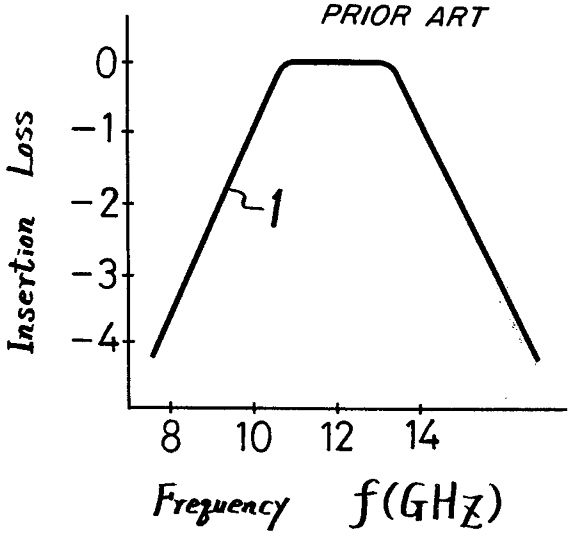
FIG. 3 PRIOR ART
FIG. 3 is a graph showing the frequency characteristic of the insertion loss of the band pass filter shown in FIG. 2.
Figure 4:
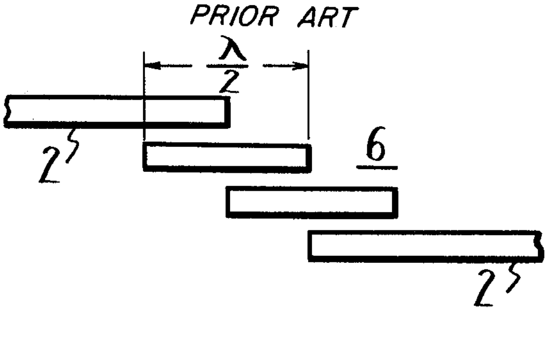
FIG. 4 PRIOR ART
FIG. 4 is a diagram showing a line pattern of another prior art band pass filter.
Figure 5:
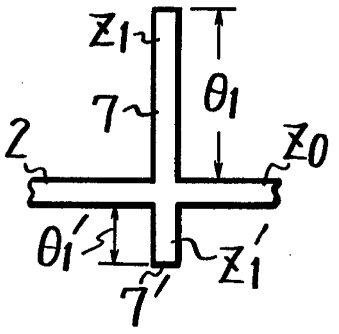
FIG. 5 is a diagram showing a line pattern of an example of the microwave circuit according to the invention.

At first, such a circuit will be considered which consists of a main transmission line 2 and two stubs 7 and 7' provided at both sides of the main transmission line 2 and different in length as shown in FIG. 5. In the figure, Z (namely $Z_0$, $Z_1$ and $Z_1'$) and $\theta$(namely $\theta_1$ and $\theta_1'$) represent an impedance and electrical angle of the respective lines. In FIG. 5, only the pattern of the transmission line of the circuit is shown, but the circuit may be formed of such a construction as a strip line or micro strip line.

The F matrix of the circuit shown in FIG. 5 can be expressed as follows:

$$F = \begin{pmatrix} 1 & 0 \\ Y & 1 \end{pmatrix},\ Y = j\frac{\tan\theta 1}{Z_1} + j\frac{\tan\theta 1'}{Z_1} \quad (1)$$

Figure 6:
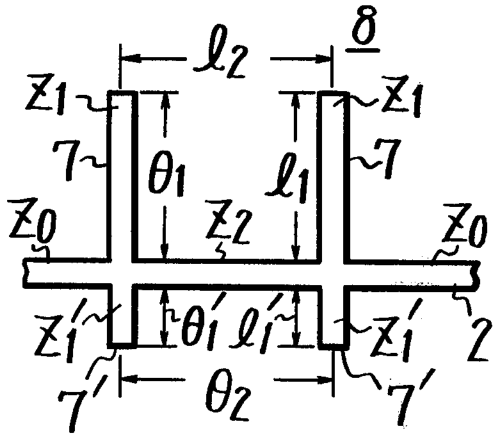
FIG. 6 is a diagram showing a line pattern of an example of the filter circuit according to the invention.

Next, a circuit 8 which consists of two circuits, each being the same as that shown in FIG. 5, connected in cascade as shown in FIG. 6 will be considered. The circuit 8 is an example of the invention which will be clear from the later description. The F matrix of the circuit 8 can be expressed as follows:

$$F = \begin{pmatrix} 1 & 0 \\ Y & 1 \end{pmatrix} \begin{pmatrix} \cos\theta_2 & jZ_2\sin\theta_2 \\ j\sin^{\theta 2}/Z_2 & \cos\theta_2 \end{pmatrix} \begin{pmatrix} 1 & 0 \\ Y & 1 \end{pmatrix} = \begin{pmatrix} A & B \\ C & D \end{pmatrix} \quad (2)$$

The transmission coefficient $S_{21}$ of a signal from the input to the output of the circuit 8 is expressed as follows:

$$S_{21} = \frac{2}{A + \frac{B}{Z_0} + CZ_0 + D}$$

If it is assumed that $Z_1 = Z_1' = Z_2 = Z_0$ for the sake of simplicity, the above transmission coefficient $S_{21}$ can be expressed as follows:

$$S_{21} = \frac{1 + \tan^2\theta_2}{1 - (\tan\theta_1 + \tan\theta_1')\tan\theta_2 + j\tan\theta_1 + \tan\theta_1' + \tan\theta_2 - \frac{1}{2}(\tan\theta_1 + \tan\theta_1')^2\tan\theta_2} \quad (4)$$

The condition of the frequency for the complete transmission through the circuit 8 or filter is as follows:

$$|S_{21}|^2 = 1 \quad (5)$$

From the equation (5), the following equation (6) is obtained.

$$(\tan\theta_1 + \tan\theta_1')\tan\theta_2 = 2 \quad (6)$$

In frequencies $f_A$ and $f_A'$ where maximum attenuation is presented in the attenuation region (generally, $f_A$ is a frequency lower than the pass band and $f_A'$ is a frequency higher than the pass band), the following equations are established.

$$\left.\begin{aligned} \tan\theta_1 &= \tan\frac{2\pi}{\lambda A} l_1 = \infty \\ \tan\theta_1' &= \tan\frac{2\pi}{\lambda' A} l_1' = \infty \end{aligned}\right\} \quad (7)$$

Figure 7:
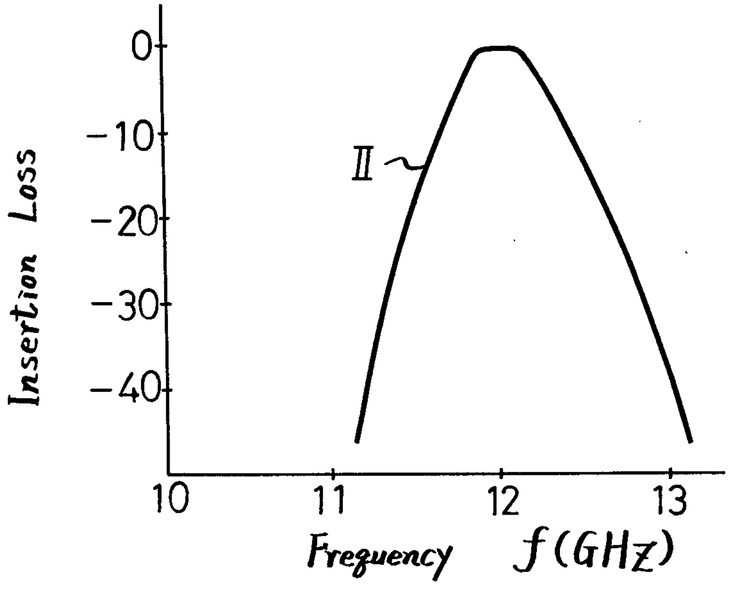
FIG. 7 is a graph showing a typical example of the insertion loss to frequency characteristics of the filter circuit shown in FIG. 6.

By the above equation (7), the lengths $l_1$ and $l_1'$ of the stubs 7 and 7' are determined, respectively. When the values of the lengths $l_1$ and $l_1'$ and that of the center frequency $f_S$ in the pass band are substituted into the above equation (6), a distance $l_2$ between the stubs 7 and 7' can be obtained. In other words, if the center frequency in the pass band and the attenuation polar frequencies before and after the center frequency are given in the circuit 8 of FIG. 6, a band pass filter can be designed. In this case, since the attenuation polar frequency can be selected desirably, if it is selected close approximity to the pass band, the sharp rising-up and falling-down characteristics can be realized. The frequency characteristic of the insertion loss in the circuit 8 of FIG. 6 is typically shown in the graph of FIG. 7 by a curve II.

In the above example, it is assumed that $Z_1 = Z_1' = Z_2 = Z_0$ is satisfied and then the equations following that (4) are calculated. However, when $Z_1$ and $Z_1'$ are selected as values other than $Z_0$, if the condition making the following input reflection coefficient $S_{11}$ of the circuit zero i.e. condition for making input voltage stationary wave rate minimum is added, $Z_2$ is determined and the discussion same as that above can be established.

$$S_{11} = \frac{A + \frac{B}{Z_0} - CZ_0 - D}{A + \frac{B}{Z_0} + CZ_0 + D} \quad (8)$$

Further, in the above example, the stubs 7 and 7' are opened at their free ends. However, it may be possible that a substantially similar filter circuit is designed by using stubs whose ends are short-circuited or the combination of a stub having an open end with a stub having a short-circuited end.

Figure 8:
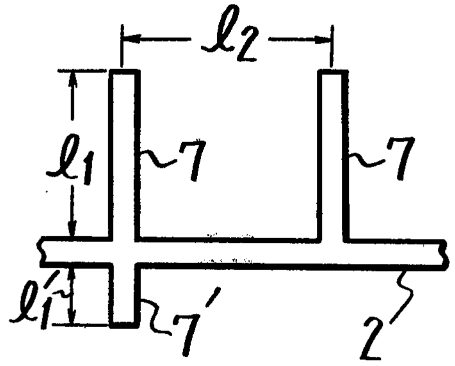
FIG. 8 is a diagram showing a line pattern of another example of the filter circuit of the invention.

FIG. 8 shows another example of the invention. In this example, stubs 7, 7 are provided on a main transmission line 2 at two positions with a predetermined distance therebetween, and one of the stubs 7, 7 is extended through the main transmission line 2 to the other side or a stub 7' is provided on the line 2 at the same position as one of the stub 7 but opposite in side and has a length $l_1'$ different from that $l_1$ of the stub 7. In this case, by suitably selecting the lengths $l_1$, $l_1'$ of the stubs 7, 7' and the distance $l_2$ between the stubs 7, 7, a filter circuit having sharp rising-up and falling-down characteristics can be provided.

In the examples of the invention shown in FIGS. 6 and 8, the stubs are provided on the main transmission line at two positions but this invention can be applied to such a construction in which the stubs are provided on the main transmission line at more than ture positions. In the latter case, at least one stub is formed such that it extends through the main transmission line to the both side thereof with different lengths.

According to the present invention described above, two frequencies which are very close can be separated by a simple circuit construction. In such a case that a signal frequency, a local oscillation frequency and an image frequency, for example, are close with one another in a mixer circuit, if the filter circuit of the present invention is provided at the signal input side of the mixer circuit, the leakage of the local oscillation signal can be avoided and also the trap operation for the image frequency signal can be achieved.

It will be apparent that many modifications and variations could be effected by one skilled in the art without departing from the spirits or scope of the novel concepts of the present invention, so that the spirits or scope of the invention should be determined by the appended claims.

I claim as my Invention:

1. A microwave circuit comprising, a dielectric; a transmission line mounted on one surface of said dielectric, a conductor mounted on the other surface of said dielectric, and at least two stubs provided on said transmission line at different positions thereof, said two stubs extending transversely to said transmission line on one side thereof for a distance $l_1$, and having electrical angles of $\theta_1$ and spaced apart a distance $l_2$ and an electrical angle of $\theta_2$, at least one of said stubs extending across said transmission line on both sides of said transmission line and having a different length $l_1'$, and electrical angle $\theta_1'$ which differ from $l_1$ and $\theta_1$ and wherein $$(\tan\theta_1 + \tan\theta_1')\tan\theta_2 = 2$$

and $$\tan\theta_1 = \tan\frac{2\pi}{\lambda A} l_1 = \infty$$

$$\tan\theta_1' = \tan\frac{2\pi}{\lambda' A} l_1' = \infty$$

where $\lambda A$ and $\lambda' A$ corresponds to frequencies $f_A$ and $f_A'$ where maximum attenuation occurs above and below the pass band.

* * * * *